(12) United States Patent
Agarwal et al.

(10) Patent No.: US 10,593,620 B2
(45) Date of Patent: Mar. 17, 2020

(54) FAN-OUT PACKAGE WITH MULTI-LAYER REDISTRIBUTION LAYER STRUCTURE

(71) Applicants: Rahul Agarwal, Livermore, CA (US); Milind S. Bhagavat, Los Altos, CA (US); Priyal Shah, San Jose, CA (US)

(72) Inventors: Rahul Agarwal, Livermore, CA (US); Milind S. Bhagavat, Los Altos, CA (US); Priyal Shah, San Jose, CA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 15/965,576

(22) Filed: Apr. 27, 2018

(65) Prior Publication Data
US 2019/0333851 A1    Oct. 31, 2019

(51) Int. Cl.
| | |
|---|---|
| *H01L 23/522* | (2006.01) |
| *H01L 23/00* | (2006.01) |
| *H01L 23/31* | (2006.01) |
| *H01L 21/56* | (2006.01) |

(52) U.S. Cl.
CPC ........ *H01L 23/5226* (2013.01); *H01L 21/565* (2013.01); *H01L 21/568* (2013.01); *H01L 23/3157* (2013.01); *H01L 24/17* (2013.01); *H01L 2224/02373* (2013.01); *H01L 2224/02379* (2013.01); *H01L 2924/3511* (2013.01)

(58) Field of Classification Search
CPC ..... H01L 2224/02379; H01L 2224/024; H01L 23/5226; H01L 2924/3511
See application file for complete search history.

(56) References Cited

U.S. PATENT DOCUMENTS

| | | |
|---|---|---|
| 9,478,504 B1* | 10/2016 | Shen ................. H01L 23/49838 |
| 2002/0172026 A1 | 11/2002 | Chong et al. |
| 2003/0016133 A1 | 1/2003 | Egbert |
| 2009/0135574 A1 | 5/2009 | Tanaka et al. |
| 2011/0010932 A1 | 1/2011 | Tanaka et al. |
| 2012/0007211 A1 | 1/2012 | Aleksov et al. |
| 2012/0286419 A1 | 11/2012 | Kwon et al. |
| 2013/0049127 A1 | 2/2013 | Chen et al. |
| 2013/0062760 A1 | 3/2013 | Hung et al. |
| 2013/0168854 A1 | 7/2013 | Karikalan et al. |
| 2014/0102768 A1 | 4/2014 | Shizuno et al. |
| 2014/0264791 A1 | 9/2014 | Manusharow et al. |
| 2014/0332966 A1 | 11/2014 | Xiu et al. |

(Continued)

OTHER PUBLICATIONS

Ron Huemoeller et al.; *Silicon Wafer Integrated Fan-Out Technology*; ChipScaleReview.com; Mar. & Apr. 2015; pp. all.

*Primary Examiner* — Quoc D Hoang
(74) *Attorney, Agent, or Firm* — Timothy M. Honeycutt

(57) ABSTRACT

Various fan-out devices are disclosed. In one aspect, a semiconductor chip device is provided that includes a redistribution layer (RDL) structure. The RDL structure includes plural metallization layers and plural polymer layers. One of the polymer layers is positioned over one of the metallization layers. The one of the metallization layers has conductor traces. The one of the polymer layers has an upper surface that is substantially planar at least where the conductor traces are positioned. A semiconductor chip is positioned on and electrically connected to the RDL structure. A molding layer is positioned on the RDL structure and at least partially encases the semiconductor chip.

14 Claims, 5 Drawing Sheets

(56) References Cited

U.S. PATENT DOCUMENTS

| | | |
|---|---|---|
| 2015/0001717 A1 | 1/2015 | Karhade et al. |
| 2015/0001733 A1 | 1/2015 | Karhade et al. |
| 2015/0048515 A1 | 2/2015 | Zhang et al. |
| 2015/0092378 A1 | 4/2015 | Roy et al. |
| 2015/0228583 A1 | 8/2015 | Karhade et al. |
| 2015/0340459 A1 | 11/2015 | Lee |
| 2016/0085899 A1 | 3/2016 | Qian et al. |
| 2016/0181189 A1 | 6/2016 | Qian et al. |
| 2018/0040546 A1* | 2/2018 | Yu .................. H01L 21/4846 |

* cited by examiner

FAN-OUT PACKAGE WITH MULTI-LAYER REDISTRIBUTION LAYER STRUCTURE

BACKGROUND OF THE INVENTION

A conventional type of multi-chip module includes two semiconductor chips mounted side-by-side on a carrier substrate or in some cases on an interposer (so-called "2.5D") that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

One conventional variant of 2.5D interposer-based multi-chip modules uses a silicon interposer with multiple internal conductor traces for interconnects between two chips mounted side-by-side on the interposer. The interposer is manufactured with multitudes of through-silicon vias (TSVs) to provide pathways between the mounted chips and a package substrate upon which the interposer is mounted. The TSVs and traces are fabricated using large numbers of processing steps.

Another conventional multi-chip module technology is 2D wafer-level fan-out (or 2D WLFO). Conventional 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

Some other conventional designs use embedded interconnect bridges (EMIB). These are typically silicon bridge chips (but occasionally organic chiplets with top side only input/outputs) that are embedded in the upper reaches of a package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
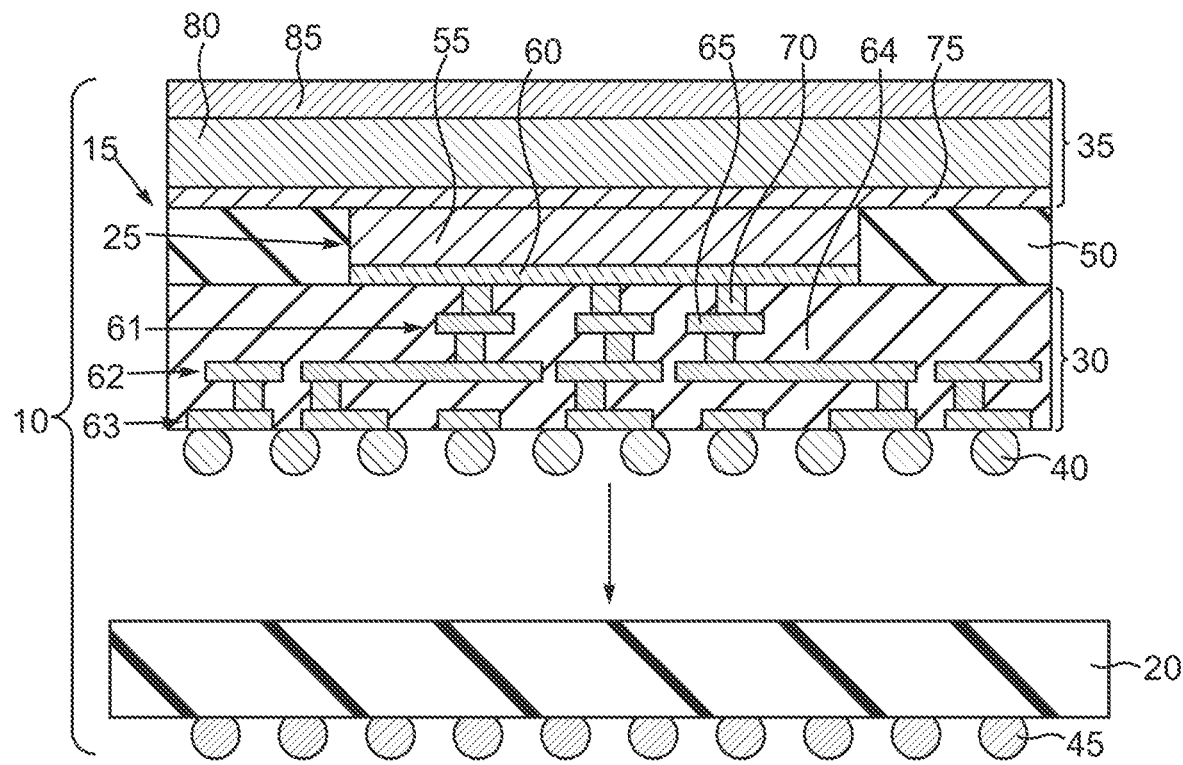
FIG. 1 is a partially exploded sectional view of an exemplary arrangement of a semiconductor chip device that includes a reconstituted chip package mounted on a circuit board.

Chip geometries have continually fallen over the past few years. However the shrinkage in chip sizes has been accompanied by an attendant increase in the number of input/outputs for a given chip. This has led to a need to greatly increase the number of chip-to-chip interconnects for multi-chip modules. Current 2D and 3D WLFO have limited minimum line spacing, on the order of 2.0 μm/line and space. In addition, conventional WLFO techniques use one to three cured polyimide films to create the requisite RDL layers. These polyimide films tend to be mechanical stress, and thus warpage, sources and their relatively high bake temperatures can adversely impact other sensitive devices. In addition, conventional polyimide RDL film processing produces non-planar films, particularly where the polyimide film overlies underlying conductor traces. The traces are topographical discontinuities, which produce raised areas of the polyimide film. The effect is additive: as succeeding polyimide films are deposited, the non-planarity compounds, which effectively limits the number of interconnect layers that may be fabricated in conventional RDL structures. However, the disclosed techniques planarize the dielectric layers of an RDL structure, enabling more than three interconnect layers to be built into an RDL structure with an attendant increase in the available routing complexity for a fan-out package.

In accordance with one aspect of the present invention, a semiconductor chip device is provided that includes a redistribution layer (RDL) structure. The RDL structure includes plural metallization layers and plural polymer layers. One of the polymer layers is positioned over one of the metallization layers. The one of the metallization layers has conductor traces. The one of the polymer layers has an upper surface that is substantially planar at least where the conductor traces are positioned. A semiconductor chip is positioned on and electrically connected to the RDL structure. A molding layer is positioned on the RDL structure and at least partially encases the semiconductor chip.

In accordance with another aspect of the present invention, a semiconductor chip device wafer is provided that includes plural redistribution layer (RDL) structures. Each of the RDL structures includes plural metallization layers and plural polymer layers. One of the polymer layers is positioned over one of the metallization layers. The one of the metallization layers has conductor traces. The one of the polymer layers has an upper surface that is substantially planar at least where the conductor traces are positioned. Plural semiconductor chips are included. Each of the semiconductor chips is positioned on and electrically connected to one of the RDL structures. A molding layer is positioned on the RDL structures and at least partially encases the semiconductor chips.

In accordance with another aspect of the present invention, a method of manufacturing a semiconductor chip device is provided. The method includes fabricating a redistribution layer (RDL) structure. The RDL structure includes plural metallization layers and plural polymer layers. One of the polymer layers is positioned over one of the metallization layers. The one of the metallization layers has conductor traces. The one of the polymer layers is planarized to have an upper surface that is substantially planar at least where the conductor traces are positioned. A semiconductor chip is positioned on and electrically connected to the RDL structure. A molding layer is formed on the RDL structure and at least partially encases the semiconductor chip.

In the drawings described below, reference numerals are generally repeated where identical elements appear in more than one figure. Turning now to the drawings, and in particular to FIG. 1 which is a partially exploded sectional view of an exemplary arrangement of a semiconductor chip device 10 that includes a reconstituted chip package 15 that is mounted on a circuit board 20. The reconstituted chip package 15 includes one or more semiconductor chips 25 mounted on a multi-layer RDL structure 30 and topped with a warpage compensation structure 35. The RDL structure 30 includes plural I/Os 40 which are designed to electrically interface with structures (not shown) of the circuit board 20. The circuit board 20 also includes I/O structures 45 to electrically interface with some other device such as another circuit board or other (not shown). The I/Os 40 and 45 can be solder balls, solder bumps, conductive pillars, lands, pins or other types of I/Os. In this exemplary arrangement, the I/Os 40 are solder bumps and the I/Os are solder balls 45. Well-known solder compositions, such as tin-silver, tin-silver-copper or others can be used.

The semiconductor chip 25 is reconstituted by way of a molding layer 50 that is otherwise sandwiched between the RDL structure 30 and the warpage compensation structure 35. The chip 25 includes a substrate portion 55 and an interconnect portion 60. The substrate portion 55 includes the multitudes of logic and other circuit structures (not shown) that provide electronic functionality and the interconnect portion 60 includes one or more levels of metallization and interlevel dielectric layers (not shown) to connect the internal logic with the I/Os 40. The chip 25 can be any of a variety of integrated circuits. A non-exhaustive list of examples includes microprocessors, graphics processing units, accelerated processing units that combines aspects of both, memory devices, application integrated specific circuits or others. The circuit board 20 can be organic or ceramic and single, or more commonly, multilayer. Variations include semiconductor chip package substrates, system boards, daughter boards, circuit cards and others.

As described in more detail below, the multi-layer RDL structure 30 includes multiple layers 61, 62 and 63 of metallization interspersed with polymer material 64 in the form of multiple layers of polymer materials that are, through processes to be described, planarized to facilitate the creation of many metallization and dielectric layers for the RDL structure 30 and thus provide very complex RDL capability. The metallization layers 61, 62 and 63 include plural conductor traces 65 that are interconnected vertically by way of plural vias 70. The traces 65 can include or constitute traces, pads or other structures. The metallization layers 61, 62 and 63 can number more or less than three. The traces 65 and vias 70 (and any related disclosed conductors, such as pillars and pads) can be composed of various conductor materials, such as copper, aluminum, silver, gold, platinum, palladium or others.

The warpage compensation structure 35 is optional. In this illustrative arrangement, the warpage compensation structure 35 includes a glue layer 75 composed of a variety of polymeric bonding materials, such as thermoplastic or thermosetting materials. Well-known epoxies represent some examples. The glue layer 75 is used to secure a cap substrate 80 on both the chip 25 and the molding layer 50. The cap substrate 80 is preferably composed of a material that has a coefficient of thermal expansion that is relatively close to that of the chip 25. Exemplary materials include silicon, glass or other types of semiconductors. The cap substrate 80 is topped with a polymer layer 85 composed of polyimide, polybenzoxazoles, benzocyclobutene or other polymers. As described in more detail below, other arrangements do not include the top polymer layer 85 or a cap substrate 80.

Figure 2:
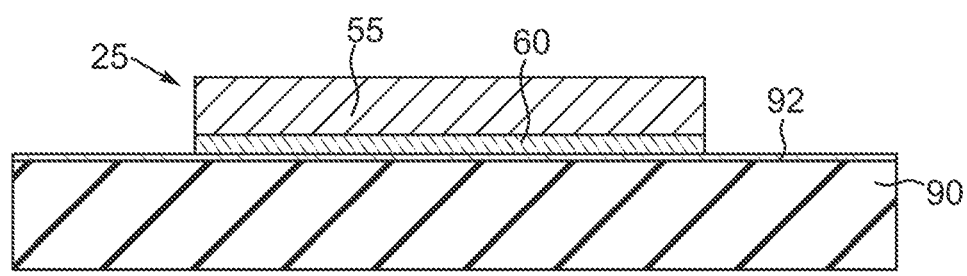
FIG. 2 is a sectional view depicting exemplary chip mounting on a carrier substrate or wafer.

An exemplary process flow for fabricating the reconstituted chip package 15 may be understood by referring now to FIGS. 2, 3, 4, 5, 6, 7, 8, 9, 10, 11, 12 and 13 and initially to FIG. 2. FIG. 2 is a sectional view depicting the chip 25 initially mounted to a carrier wafer 90 with substrate portion 55 of the chip 25 facing up and the interconnect portion 60 thereof mounted face down on the carrier wafer 90. Optionally the semiconductor chip 25 can be mounted with the substrate portion 55 facing toward the carrier wafer 90. This initial attachment of the semiconductor chip 25 to the carrier wafer 90 can be accomplished using an adhesive 92 applied to the carrier wafer 90. The adhesive 92 is preferably a well-known reversible adhesive, such as light activated or thermally activated adhesives, that can be reversed so that later the carrier wafer 90 can be removed. It should be understood that the processing described herein can be performed on a wafer level basis, that is, with multiple semiconductor chips 25 mounted on some larger carrier wafer 90 or on a discrete device basis as desired. The carrier wafer 90 can be composed of silicon, various glasses, or other types of semiconductor materials.

Figure 3:
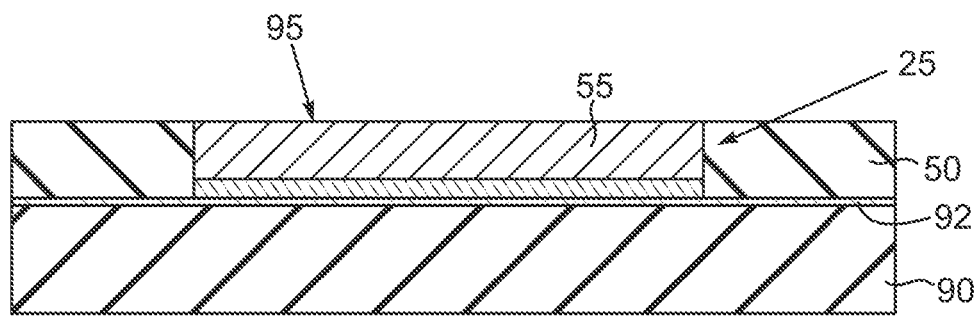
FIG. 3 is a sectional view like FIG. 2, but depicting exemplary molding layer fabrication.
Figure 4:
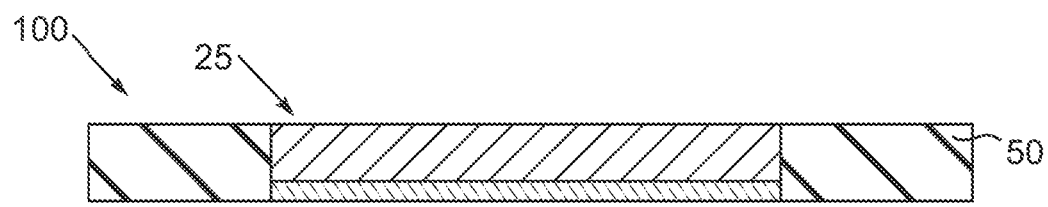
FIG. 4 is a sectional view like FIG. 3, but depicting exemplary carrier substrate removal.

Next and as shown in FIG. 3, the molding layer 50 is applied on the carrier wafer 90 and over and around the semiconductor chip 25. Two commercial variants are Sumitomo EME-G750 and G760. Well-known compression molding techniques can be used to mold the molding layer 50. After molding, the molding layer 50 is subjected to a grinding process to expose the back side 95 of the substrate portion 55 of the semiconductor chip 25. If need be, this grinding process can also perform a thinning of the semiconductor chip 25. Following the molding and grinding processes, the carrier wafer 90 is removed from the reconstituted combination of the molding layer 50 and the chip 25. The removal process will depend on the type of the adhesive 92. Examples include thermal release, chemical release, mechanical peel off or laser induced removal. As shown in FIG. 4, following the removal of the carrier wafer 90 shown in FIG. 3, the chip 25 and the molding layer 50 constitute a reconstituted wafer 100. Again, if the process is performed on a wafer level basis then there will be multitudes of chips 25 joined together by the molding layer 50.

Figure 5:
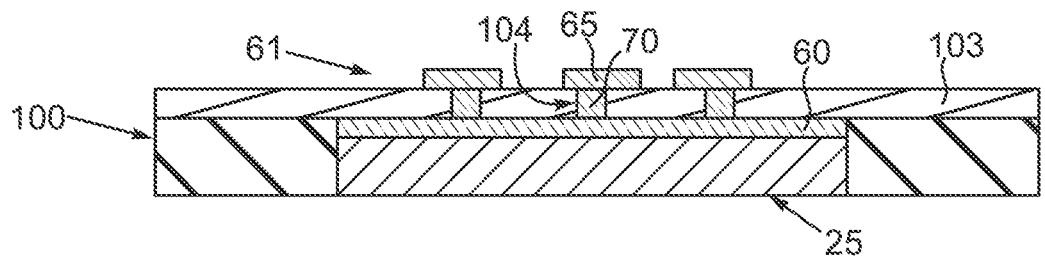
FIG. 5 is a sectional view like FIG. 4, but depicting exemplary RDL structure metallization fabrication.

Next and shown in FIG. 5, the reconstituted wafer 100 is flipped over from the orientation shown in FIG. 4 and the initial phases of the fabrication of the RDL structure 30 shown in FIG. 1 are commenced. Prior to construction of the vias 70, an initial polymer layer 103 is applied to the reconstituted wafer 100 using well-known spin coating or other techniques followed by a thermal curing process. Next, the vias 70 are formed in suitable openings 104 formed in the polymer layer 103. The openings 104 can be performed in a variety of ways, such as, for example, lithographic masking and etching of the polymer layer 103 or lithographic patterning of the polymer layer 103 (i.e., masking, exposure and development) in the event that the initial polymer layer 103 is infused with photoactive compounds. After the openings 104 are formed, the vias 70 are formed in the openings 104 by way of well-known plating, sputtering, CVD or other. After the formation of the vias 70, the conductor traces 65 of the metallization layer 61 are formed on the polymer layer 103 in ohmic contact with some or all of the vias 70 using well-known plating, sputtering, CVD or other and lithographic and etching techniques.

Figure 6:
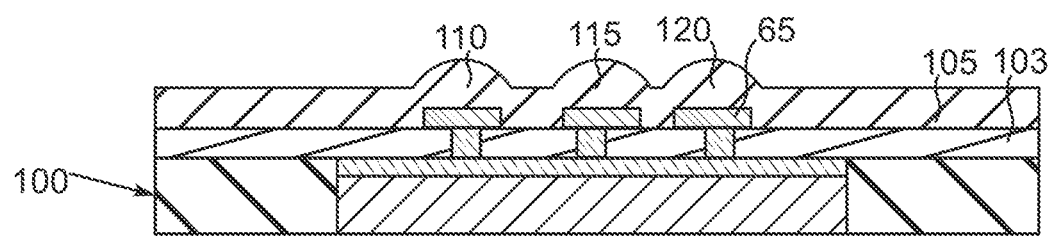
FIG. 6 is sectional view like FIG. 5, but depicting exemplary RDL polymer layer formation.

Next and as shown in FIG. 6, another polymer layer 105 that will be potentially another of several polymer layers that make up the polymer material 64 of the RDL structure 30 shown in FIG. 1 is applied to the reconstituted wafer 100 and over the conductor traces 65 and the polymer layer 103. The polymer layer 105 is applied using well-known spin coating or other techniques followed by a thermal curing process. Note that because of the presence of the conductor traces 65, when the polymer layer 105 is applied there will be formed raised areas 110, 115 and 120 over the traces 65. These raised areas 110, 115 and 120 of the polymer layer 105 limit the number of individual metallization layers that can be stacked into the RDL structure if not otherwise corrected.

Figure 7:
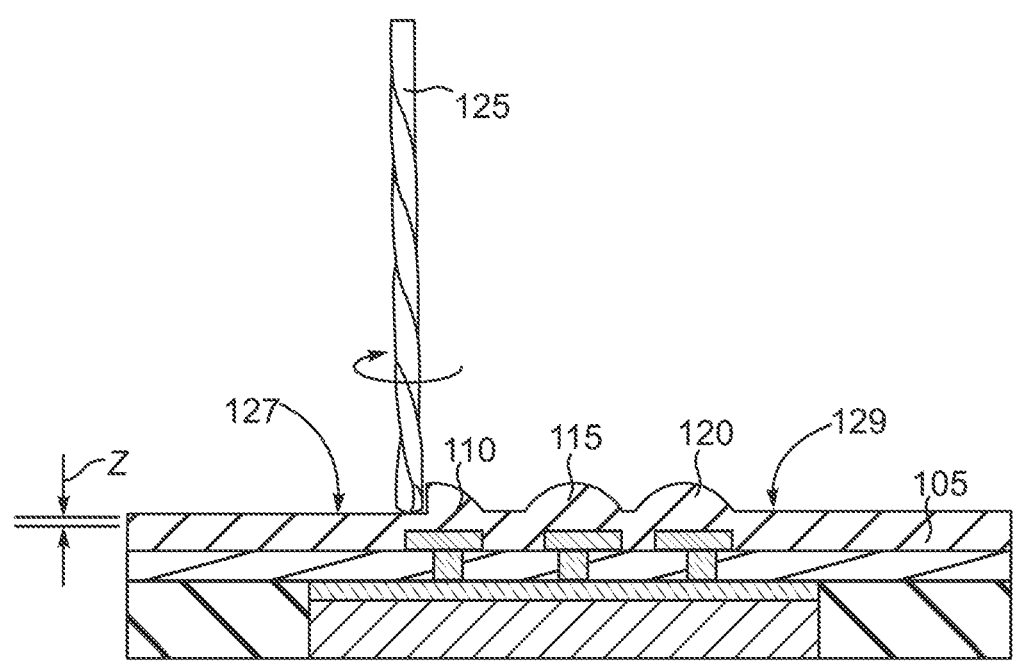
FIG. 7 is a sectional view like FIG. 6, but depicting exemplary RDL polymer layer planarization.

As shown in FIG. 7, to overcome the difficulty of the topography problems associated with raised areas 110, 115 and 120, the polymer layer 105 is subjected to a machining process using a milling tool, the bit 125 of which is shown. The milling bit 125 can be tool steel with or without diamond enhanced cutting surfaces. The bit 125 mills away the raised areas 110, 115 and 120 to leave the polymer layer 105 with a substantially planar upper surface 127. The milling process is intended to produce the substantially planar upper surface 127 at least where the underlying conductor traces 65 are located. However, the milling can be conducted so that the substantially planar surface 127 extends across the entirety of the polymer layer 105. The milling process can be performed with the bit 125 just at the unplanarized upper surface 129 of the polymer layer 105. Optionally, the bit 125 can lowered relative to the unplanarized upper surface 129 by some distance Z. This will be appropriate where the raised areas 110, 115 and 120 are not the same height. It is desirable to ensure that the lowest of such raised areas 110, 115 and 120 is/are removed by the bit 125. The distance Z is chosen to ensure that the lowest of the raised areas 110, 115 and 120 is/are cut away by the bit 125. A cleaning process is performed after the machining to remove debris from the polymer layer 105.

Figure 8:
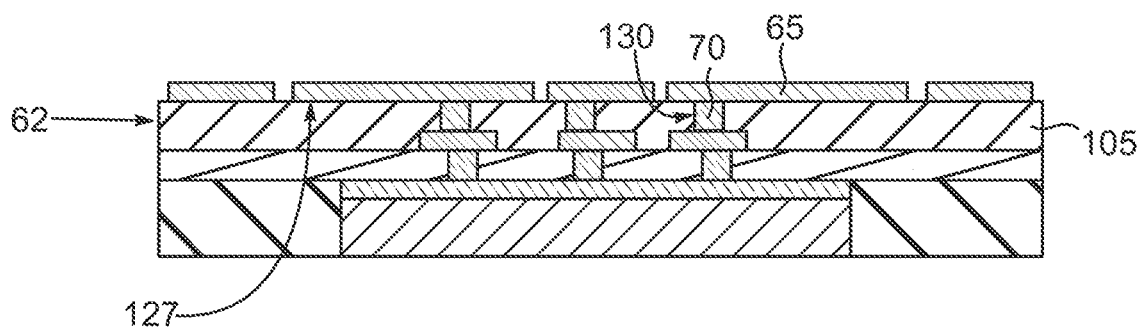
FIG. 8 is a sectional view like FIG. 7, but depicting exemplary additional RDL structure metallization fabrication.

Next and as shown in FIG. 8, vias 70 are formed in suitable openings 130 formed in the polymer layer 105. The openings 130 can be performed in a variety of ways, such as, for example, lithographic masking and etching of the polymer layer 105, or lithographic patterning of the polymer layer 105 (i.e., masking, exposure and development) in the event that the polymer layer 105 is infused with photoactive compounds. After the openings 130 are formed, the vias 70 are formed in the openings 130 by way of well-known plating, sputtering, CVD or other. After the formation of the vias 70, the conductor traces 65 of the metallization layer 62 are formed on the substantially planar upper surface 127 of the polymer layer 105 in ohmic contact with some or all of the vias 70 using well-known plating, sputtering, CVD or other and lithographic and etching techniques.

Figure 9:
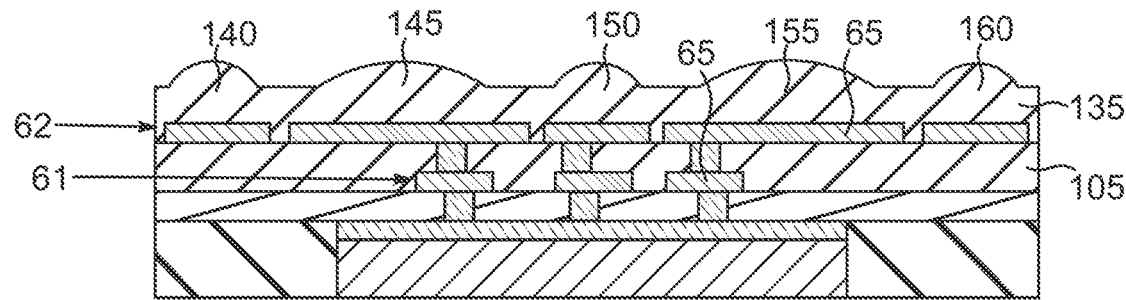
FIG. 9 is a sectional view like FIG. 8, but depicting exemplary additional RDL polymer layer formation.
Figure 10:
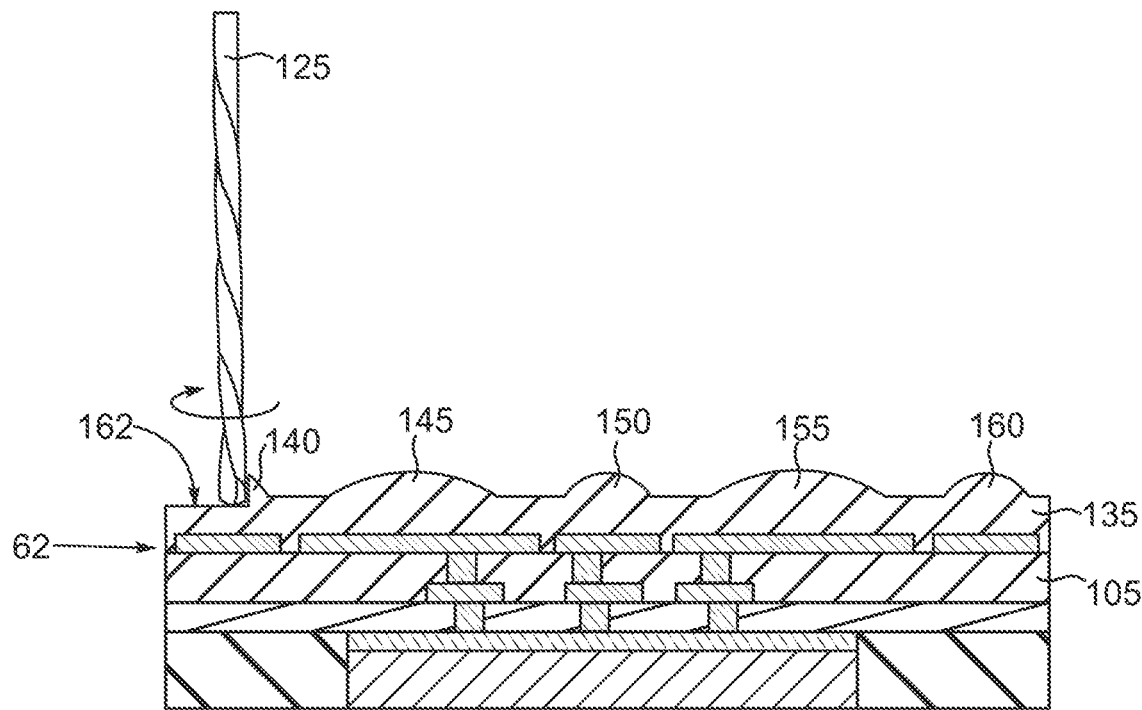
FIG. 10 is a sectional view like FIG. 9, but depicting exemplary RDL polymer layer planarization.

Next and as shown in FIG. 9, another polymer layer 135 is applied over the conductor traces 65 and the polymer layer 105 using well-known spin coating or other techniques followed by a thermal curing process. As was the case of the polymer layer 105 and the conductor traces 65 of the metallization layer 61, the presence of the underlying conductor traces 65 of the metallization layer 62 causes the polymer layer 135 to have plural vertical discontinuities or raised areas 140, 145, 150, 155 and 160 over the underlying traces 65 of the layer 62. To deal with these raised areas 140, 145, 150, 155 and 160, the polymer layer 135 is subjected to milling by way of the mill bit 125 as described above in conjunction with FIG. 7 to leave the polymer layer 135 with a substantially planar upper surface 162. The milling process is intended to produce the substantially planar upper surface 162 at least where the underlying conductor traces 65 of the metallization layer 62 are located. However, the milling can be conducted so that the substantially planar surface 162 extends across the entirety of the polymer layer 135. A cleaning process is performed after the machining to remove debris from the polymer layer 135. Subsequent to the milling process, openings (not shown) can be formed in the polymer layer 135 and additional vias 70 formed therein and additional traces 65 formed thereon, etc. using the processes described above in conjunction with the polymer layer 105, the vias 70 and the traces 65 shown in FIG. 8. This process of fabricating traces, polymer layer formation with milling for planarization, and via fabrication can be repeated as many times as desired in order to provide a very complicated multi-layer RDL structure of the type 30 shown in FIG. 1.

Figure 11:
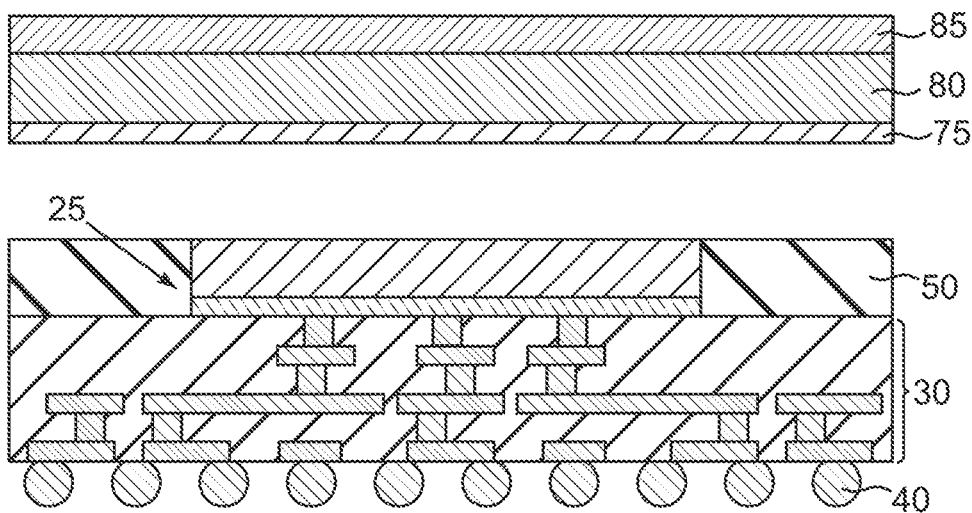
FIG. 11 is a sectional view like FIG. 11, but depicting exemplary warpage compensation structure attachment.

Thus, as shown in FIG. 11, the RDL structure 30 is complete and I/Os 40 can be secured thereto. If solder bumps or balls, the I/Os 40 can be formed by plating, stencil and paste, pick and place or other techniques followed by a reflow. The glue layer 75 is applied to the cap substrate 80, but could optionally be applied to the molding layer 50 and the semiconductor chip 25. The glue layer 75 can be applied using well-known spin coating or other application techniques. Subsequently, the cap substrate 80 is mounted on the glue layer 75 with or without the top polymer layer 85 in place. For example, it is possible to first form the polymer layer 85 on the cap substrate 80 and thereafter mount the cap substrate 80 on the glue layer 75. For example, the cap substrate 80 and the polymer layer 85 can be fabricated on a wafer level basis and applied as a wafer to the glue layer 75. The polymer layer 85 can be applied using well-known spin coating and baking techniques. Thereafter, the reconstituted package consisting of the cap substrate 80 on the glue layer 75 and the underlying components can be singulated into the individual reconstituted chip packages 15, an example which is shown in FIG. 1. Following singulation, the reconstituted chip package 15 can be mounted to the circuit board 20 to yield the completed semiconductor chip device 10 shown in FIG. 1. Depending on the type of I/Os 40, this will entail a solder reflow or other type of joining process.

Figure 12:
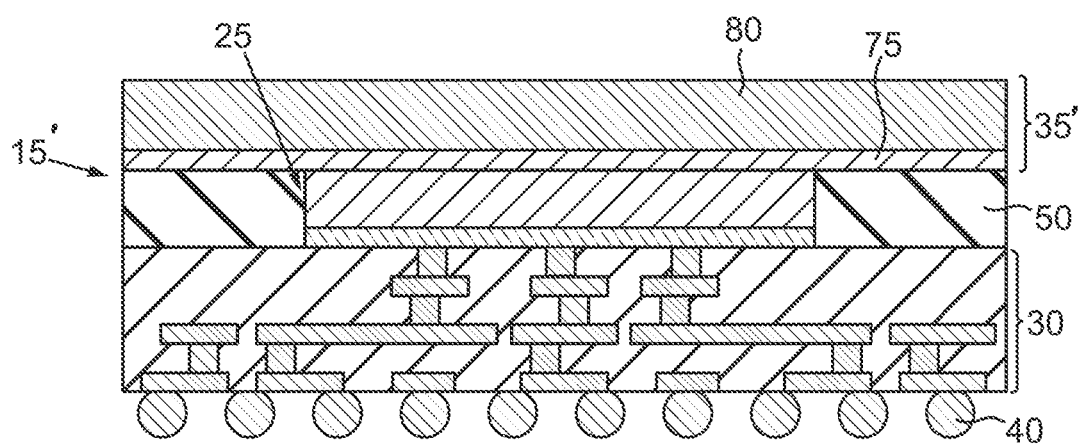
FIG. 12 is a sectional view like FIG. 1, but depicting an alternate exemplary semiconductor chip device.
Figure 13:
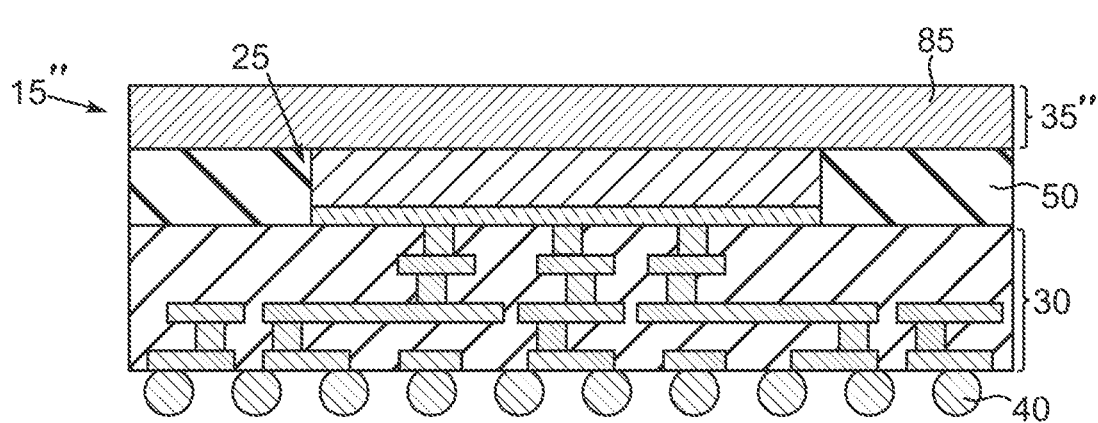
FIG. 13 is a sectional view like FIG. 1, but depicting another alternate exemplary semiconductor chip device.

As noted above, a variety of warpage compensation structures can be used other than the warpage compensation structure 35 depicted in the arrangement of FIG. 1. FIG. 12 is a sectional view like FIG. 1 depicting an alternate exemplary reconstituted package 15' but without the circuit board 20 shown. The reconstituted package 15' includes the same basic components, namely, the chip 25, the RDL structure 30 and the molding layer 50. However, an alternate warpage structure 35' is used. Here, the warpage compensation structure 35' includes the aforementioned glue layer 75 and the cap substrate 80. However, the top polymer layer 85 shown in FIG. 1 is not used. In yet another arrangement depicted in FIG. 13, which is a similar sectional view, an alternative reconstituted package 15" again includes the chip 25, the RDL structure 30 and the molding layer 50. However, an alternative warpage compensation structure 35' consists of the cap polymer layer 85 without either a cap substrate 80 or glue layer 75 shown in FIG. 1. Here, the polymer layer 85 can be thicker as desired than the alternatives thereof used with the cap substrate 80 as desired. The polymer layer 85 can be applied using well-known spin coating and baking techniques. If wafer level processing is used for the arrangements in FIGS. 12 and 13, the singulation and circuit mounting will follow as described for the other disclosed alternative.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip device, comprising:
    a redistribution layer (RDL) structure including plural metallization layers and plural polymer layers, one of the polymer layers being positioned over one of the metallization layers, the one of the metallization layers having conductor traces, the one of the polymer layers having an upper surface that is substantially planar at least where the conductor traces are positioned;
    a semiconductor chip positioned on and electrically connected to the RDL structure;
    a molding layer positioned on the RDL structure and at least partially encasing the semiconductor chip; and
    a warpage compensation structure positioned on the molding layer, the warpage compensation structure including a cap substrate and a polymer layer positioned on the cap substrate.

2. The semiconductor chip device of claim 1, wherein the cap substrate comprises a semiconductor or a glass.

3. The semiconductor chip device of claim 1, comprising a circuit board, the RDL structure being mounted on and electrically connected to the circuit board.

4. The semiconductor chip device of claim 3, wherein the circuit board comprises a semiconductor chip package substrate.

5. The semiconductor chip device of claim 1, comprising plural I/Os coupled to the RDL structure adapted to connect to a circuit board.

6. A semiconductor chip device wafer, comprising:
    plural redistribution layer (RDL) structures including plural metallization layers and plural polymer layers, one of the polymer layers being positioned over one of the metallization layers, the one of the metallization layers having conductor traces, the one of the polymer layers having an upper surface that is substantially planar at least where the conductor traces are positioned;
    plural semiconductor chips, each of the semiconductor chip being positioned on and electrically connected to one of the RDL structures;
    a molding layer positioned on the RDL structures and at least partially encasing the semiconductor chips; and
    a warpage compensation structure positioned on the molding layer, the warpage compensation structure including a cap substrate and a polymer layer positioned on the cap substrate.

7. The semiconductor chip device wafer of claim 6, wherein the cap substrate comprises a semiconductor or a glass.

8. The semiconductor chip device wafer of claim 6, comprising plural I/Os coupled to each of the RDL structures adapted to connect to a circuit board.

9. The semiconductor chip device wafer of claim 6, wherein each of the RDL structures comprises at least three metallization layers.

10. A method of manufacturing a semiconductor chip device, comprising:
    fabricating a redistribution layer (RDL) structure including plural metallization layers and plural polymer layers, one of the polymer layers being positioned over one of the metallization layers, the one of the metallization layers having conductor traces;
    planarizing one of the polymer layers to have an upper surface that is substantially planar at least where the conductor traces are positioned;
    positioning a semiconductor chip on the RDL structure and electrically connecting the semiconductor chip to the RDL structure;
    forming a molding layer on the RDL structure and at least partially encasing the semiconductor chip; and
    coupling a warpage compensation structure on the molding layer, the warpage compensation structure including a cap substrate and a polymer layer on the cap substrate.

11. The method of claim 10, comprising mounting the RDL structure on a circuit board.

12. The method of claim 11, wherein the circuit board comprises a semiconductor chip package substrate.

13. The method of claim 10, wherein the cap substrate comprises a semiconductor or a glass.

14. The method of claim 10, comprising coupling plural I/Os to the RDL structure adapted to connect to a circuit board.

* * * * *